(12) United States Patent
Weichert et al.

(10) Patent No.: US 9,780,740 B2
(45) Date of Patent: Oct. 3, 2017

(54) PASSIVE FEEDBACK PATH FOR PRE-DISTORTION IN POWER AMPLIFIERS

(71) Applicant: TriQuint Semiconductor, Inc., Hillsboro, OR (US)

(72) Inventors: Calvin Weichert, Amherst, NH (US); Akbar Hirani, Wilmington, MA (US); Jeffrey A. Shatzman, Somerville, MA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/153,935

(22) Filed: Jan. 13, 2014

(65) Prior Publication Data

US 2015/0200702 A1  Jul. 16, 2015

(51) Int. Cl.
*H03F 3/19* (2006.01)
*H03F 3/195* (2006.01)
*H04B 1/04* (2006.01)
*H04B 1/18* (2006.01)
*H03F 1/32* (2006.01)
*H03F 3/24* (2006.01)

(52) U.S. Cl.
CPC ........... *H03F 3/195* (2013.01); *H03F 1/3247* (2013.01); *H03F 3/24* (2013.01); *H04B 1/0475* (2013.01); *H04B 1/18* (2013.01); *H03F 2200/411* (2013.01); *H04B 2001/0408* (2013.01)

(58) Field of Classification Search
USPC ................................. 375/297, 296, 324, 354
See application file for complete search history.

(56) References Cited

U.S. PATENT DOCUMENTS

| | | | | |
|---|---|---|---|---|
| 4,584,541 A | * | 4/1986 | Nossen | H03C 1/00 332/145 |
| 2002/0009979 A1 | * | 1/2002 | Kusunoki | 455/117 |
| 2004/0189378 A1 | * | 9/2004 | Suzuki et al. | 330/52 |
| 2007/0190952 A1 | * | 8/2007 | Waheed et al. | 455/114.3 |
| 2009/0316826 A1 | * | 12/2009 | Koren | H04L 27/367 375/296 |
| 2013/0122956 A1 | * | 5/2013 | Lee et al. | 455/522 |
| 2013/0176161 A1 | * | 7/2013 | Derham | G01S 7/36 342/27 |

* cited by examiner

*Primary Examiner* — Kabir A Timory
(74) *Attorney, Agent, or Firm* — Withrow & Terranova, P.L.L.C.

(57) ABSTRACT

Embodiments of the present disclosure describe apparatuses, methods, and systems of front end module (FEM) having a feedback path that includes a passive attenuation network. The passive attenuation network may provide a feedback signal to a receive output port of the FEM that may be used as a basis for predistortion. Other embodiments may also be described and/or claimed.

16 Claims, 4 Drawing Sheets

PASSIVE FEEDBACK PATH FOR PRE-DISTORTION IN POWER AMPLIFIERS

FIELD

Embodiments of the present disclosure generally relate to the field of integrated circuits, and more particularly, to a passive feedback path for pre-distortion in power amplifiers.

BACKGROUND

Power amplifiers are an integral part of a wireless communication system. They are responsible for establishing and maintaining a link between the mobile station (MS) and base station (BS). Power amplifiers are non-linear in nature and, when operated close to saturated power (PSAT), can cause out-of-band emissions and degraded adjacent channel power ratio (ACPR).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide a passive feedback path for pre-distortion in power amplifiers. In some embodiments, the passive feedback path may include a passive attenuation network.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
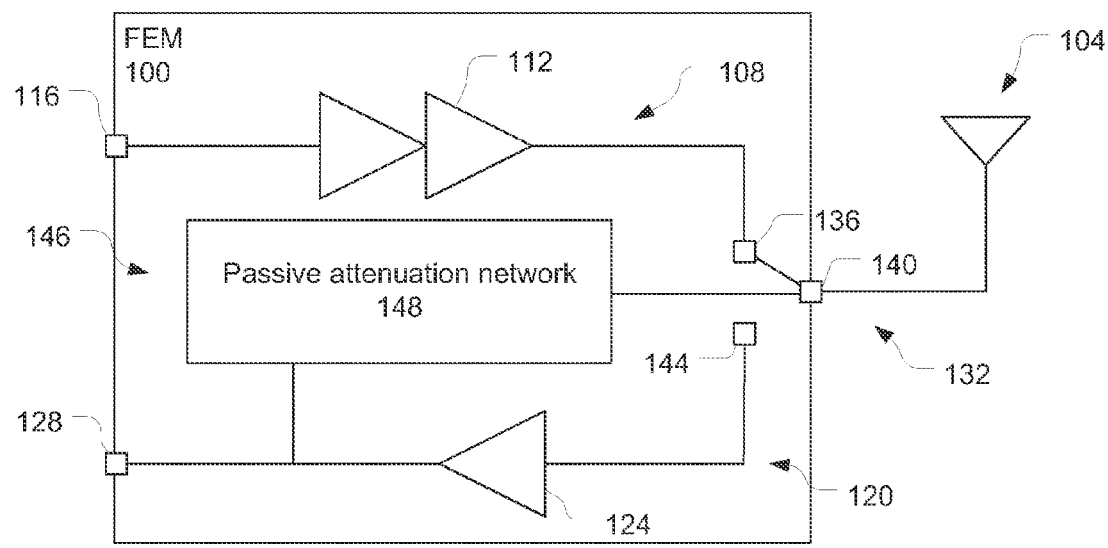
FIG. 1 schematically illustrates a front end module according to various embodiments.

FIG. 1 schematically illustrates a front-end module (FEM) 100 according to various embodiments. The FEM 100 may be coupled with an antenna 104. In various embodiments, the FEM 100 may be incorporated into a wireless communication device as described below with respect to FIG. 3.

The FEM 100 may include a transmit path 108 that includes a power amplifier 112. The power amplifier 112 may receive a radio-frequency (RF) signal at a terminal 116 and amplify the RF signal for a subsequent over-the-air (OTA) transmission via the antenna 104.

The FEM 100 may further include a receive path 120 that includes a low-noise amplifier (LNA) 124. The LNA 124 may receive an RF signal as an incoming OTA transmission from the antenna 104, provide a low-noise amplification of the RF signal, and transmit the signal to a terminal 128.

The terminals 116 and 128 may be coupled with transceiver circuitry to provide additional processing of the RF signals transmitted between the transceiver circuitry and the FEM 100. In some embodiments, terminal 116 may be referred to as a transmit (TX) input port of the FEM 100 and the terminal 128 may be referred to as a receive (RX) output port of the FEM 100.

The FEM 100 may further include a switch 132. The switch 132 may include a first terminal 136 coupled with the transmit path 108, a second terminal 140 coupled with the antenna 104, and a third terminal 144 coupled with the receive path 120. In some embodiments, the second terminal 140 may be referred to as an antenna port of the FEM 100.

The switch 132 may be controlled by a controller (not shown) to selectively couple the transmit path 108 or the receive path 120 with the antenna 104. Switch 132 is generally shown as a single pole, double throw (SPDT) switch; however, other embodiments may utilize other types of switches.

The FEM 100 may further include a feedback path 146 that includes a passive attenuation network 148. The passive attenuation network 148 (or simply "network 148") may be directly coupled with the transmit path, e.g., at terminal 140, and further directly coupled with the receive path 120, e.g., at an output of the LNA 124. When the switch 132 is in a state that couples the transmit path 108 with the antenna 104, the network 148 may provide an attenuated feedback signal to the terminal 128. In providing the attenuated signal to the terminal 128, the network 148 may bypass the LNA 124 of the receive path 120. In various embodiments, the network 148 may include one or more circuit components, e.g., resistors, varactors, etc., to provide the desired attenuation of the feedback signal. In some embodiments, to provide desired passivity of the network 148, the network may only include passive components. For example, the network 148 may not include active components such as transistors.

While the network 148 is shown as coupled with terminal 140 in FIG. 1, in other embodiments, the network 148 may be coupled with other parts of the transmit path 108 including, for example, terminal 136 or an output of the power amplifier 112.

The network 148 may provide the feedback signal to the terminal 128 in a manner that facilitates accurate sensing of an error vector magnitude (EVM) associated with the power amplifier 112 over a range of operating conditions without compromising the performance of the FEM 100.

Figure 2:
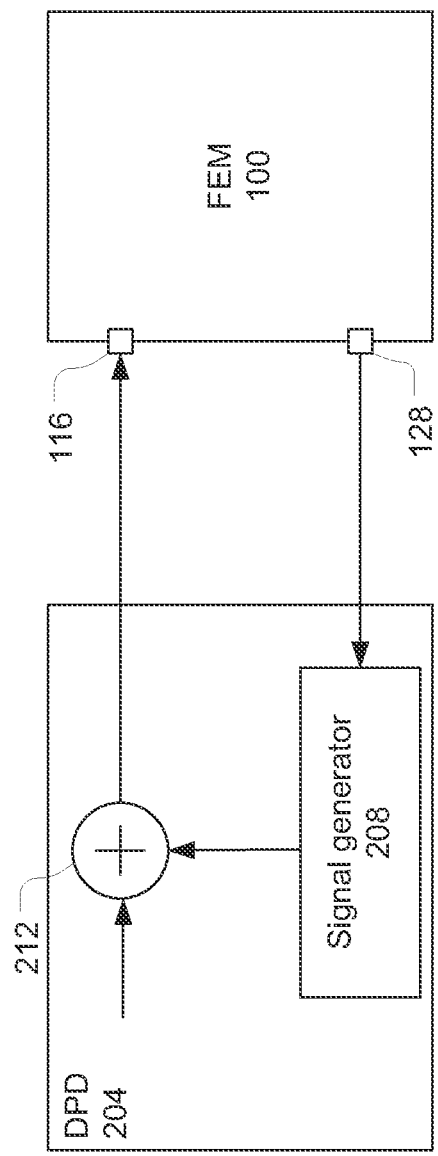
FIG. 2 schematically illustrates a radio frequency subsystem according to various embodiments.

FIG. 2 illustrates an RF subsystem 200 incorporating the FEM 100 in accordance with some embodiments. The RF subsystem 200 may include a digital predistorter (DPD) 204 coupled with the FEM 100 as shown. In general, the DPD 204 may sense an EVM associated with the power amplifier 112 and pre-distort the RF signal provided to the power amplifier 112 to improve EVM performance.

The DPD 204 may include a signal generator 208 that is coupled with terminal 128 of the FEM 100 to receive a feedback signal from the feedback path 146. The signal generator 208 may generate a predistorter (PD) signal that is provided to a combiner 212.

Combiner 212 may receive the PD signal from the signal generator 208 and combine the PD signal with an input RF signal to provide a predistorted RF signal. The predistorted RF signal may be provided to terminal 116 of the FEM 100 for amplification by the power amplifier 112.

The PD signal generated by the signal generator 208 may be based on a pre-distorter model that is designed to compensate for non-linearities inherent in the power amplifier 112. Thus, amplification of the predistorted RF signal by the power amplifier may correspond to a more linear response profile with respect to the input RF signal.

For proper operation, it is desired that the feedback path 146 of the signal that is provided to the signal generator 208 from the FEM 100 not introduce any extra non-linearities. The length of the feedback path 146 is from an output of the power amplifier 112 to an input of the signal generator 208.

The network 148 may provide the feedback path 146 with a number of desirable characteristics. For example, the network 148 may have a highly-linear response to avoid introduction of non-linearities. If the feedback path 146 were to introduce non-linearities to the feedback signal, the signal generator 208 may attempt to compensate for those non-linearities, thereby re-introducing them into the signal amplified for transmission.

The network 148 may comply with specific isolation parameters so that the signal generator 208 is not over driven. For example, the network 148 may appropriately attenuate the feedback signal to provide the feedback signal to the signal generator 208 within desired constraints. The isolation may be controlled by appropriately setting the resistance of the network 148. For example, if the network 148 includes a resistor having a resistance of 750 ohms, the isolation may be approximately 25 decibels; a resistor having a resistance of 2000 ohms may provide an isolation of approximately 34 decibels, etc. In other embodiments, the network 148 may include resistors having other resistance values including, but not limited to, 1250, 1750, and 2250 ohms. It will be understood that the resistance of the network 148 may be set according to the desired operating characteristics of a particular embodiment. In some embodiments, the network may include, for example, one or more varactors to tune frequency dependent terms of the impedance provided by the network 148.

Isolation provided by the network 148 may also prevent interference with a received wireless transmission in some embodiments. For example, when the switch 132 is in a state that couples the receive path 120 with the antenna 104 and the network 148 is coupled with terminal 140, the network 148 may provide a relatively high-resistance path. Therefore, the signal at the output of the LNA 124, which represents an amplified version of the signal received by the antenna 104, may be largely unaffected.

In embodiments, the network 148 may exhibit little-to-no variation over frequency. This may work to provide DPD 204 with a feedback signal that accurately represents EVM associated with the power amplifier 112 throughout a range of operating frequencies.

This approach may reduce the potential nonlinearities associated with using the inherent isolation of the switch 132 and off isolation of the receive path 120 when used as the feedback path for detection.

In some embodiments, the isolation of the receive path 120 may be increased to a point where signal leakage through this path is insignificant in comparison to leakage through the feedback path. Thus, the attenuation of the feedback path may be tailored to provide a desired power to the DPD 204 while maintaining a high impedance at the point at which the passive attenuation network 148 couples with the transmit path 108 so as not to degrade or modify the EVM performance of the transmit path 108.

In this manner, the network 148 may provide a frequency-independent, linear feedback path with a high-degree of flexibility in tuning the signal level fed back to the DPD 204.

Figure 3:
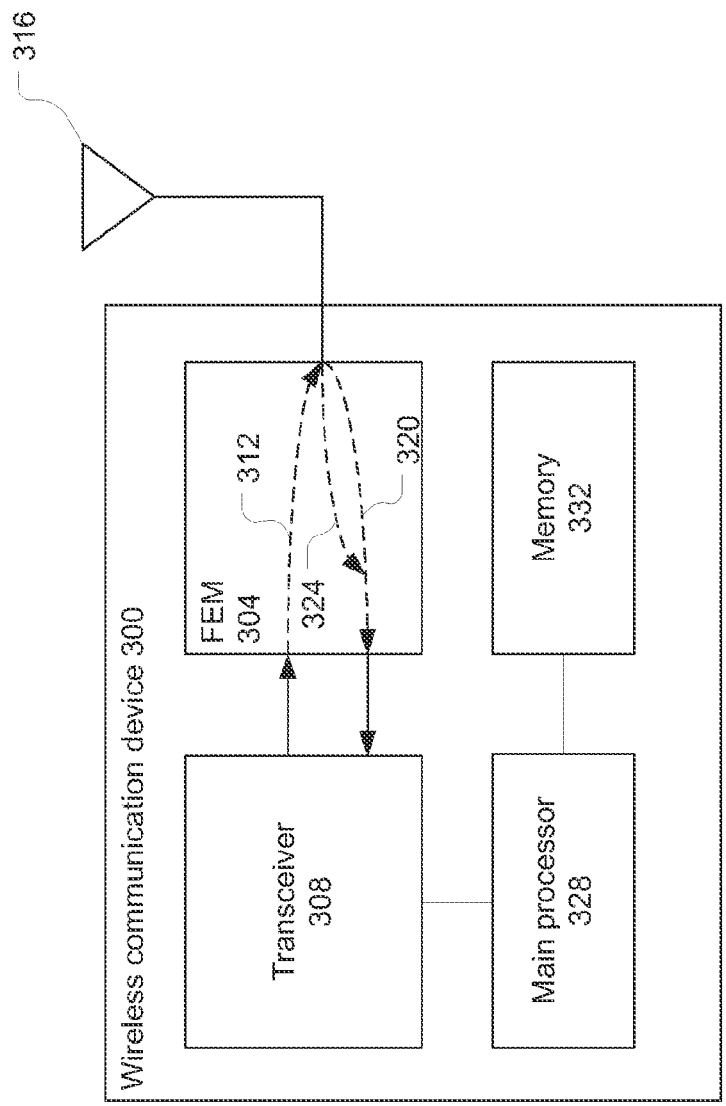
FIG. 3 schematically illustrates an example wireless communication device according to various embodiments.

An RF subsystem, for example, the RF subsystem 200, may be incorporated into various apparatuses and systems. A block diagram of an example wireless communication device 300 is illustrated in FIG. 3. As illustrated, the device 300 includes a FEM 304, which may be similar to FEM 100 in some embodiments, coupled with a transceiver 308.

The FEM 304 may have a transmit path 312 to amplify an RF signal for wireless transmission by an antenna 316; a receive path 320 to amplify an RF signal received by the antenna 316 for further processing by transceiver 308; and a feedback path 324 to provide a feedback signal based on the RF signal amplified through the transmit path 312. As described herein, the feedback signal provided by the feedback path of the FEM 304 may represent an accurate EVM signature that may form the basis for a predistoration operation to improve EVM performance of the device 300.

In various embodiments, the antenna 316 may include one or more directional and/or omnidirectional antennas, including, e.g., a dipole antenna, a monopole antenna, a patch antenna, a loop antenna, a microstrip antenna or any other type of antenna suitable for over-the-air (OTA) transmission/reception of RF signals.

The main processor 326 may execute a basic operating system program, stored in the memory 332, in order to control the overall operation of the device 300. For example, the main processor 328 may control the reception of signals and the transmission of signals by transceiver 308. The main processor 328 may be capable of executing other processes and programs resident in the memory 332 and may move data into or out of memory 332, as desired by an executing process.

The transceiver 308 may receive outgoing data (e.g., voice data, web data, e-mail, signaling data, etc.) from the main processor 328, may generate RF signals to represent the outgoing data, and provide the RF signals to the FEM 304. In a similar manner, the transceiver 308 may receive an incoming OTA signal from the FEM 304. The transceiver 308 may process and send the incoming signal to the main processor 328 for further processing.

In some embodiments, the transceiver 308 may include a DPD, such as DPD 204. As described above, the DPD may receive feedback signal from the feedback path 324 of the FEM 304, generate a PD signal based on the feedback signal, and generate a predistorted RF signal based on the PD signal and an RF signal to be transmitted. The predistored RF signal may then be provided to the transmit path 312 of the FEM 304.

The transceiver 308 and FEM 304 may be designed to operate with any of a number of wireless communication protocols. For example, in some embodiments, the transceiver 308 and FEM 304 may be configured to transmit/receive wireless signals in accordance with a wireless local area network protocol, a wireless personal area network protocol, a wireless metropolitan area network protocol, etc.

In various embodiments, the wireless communication device 300 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Figure 4:
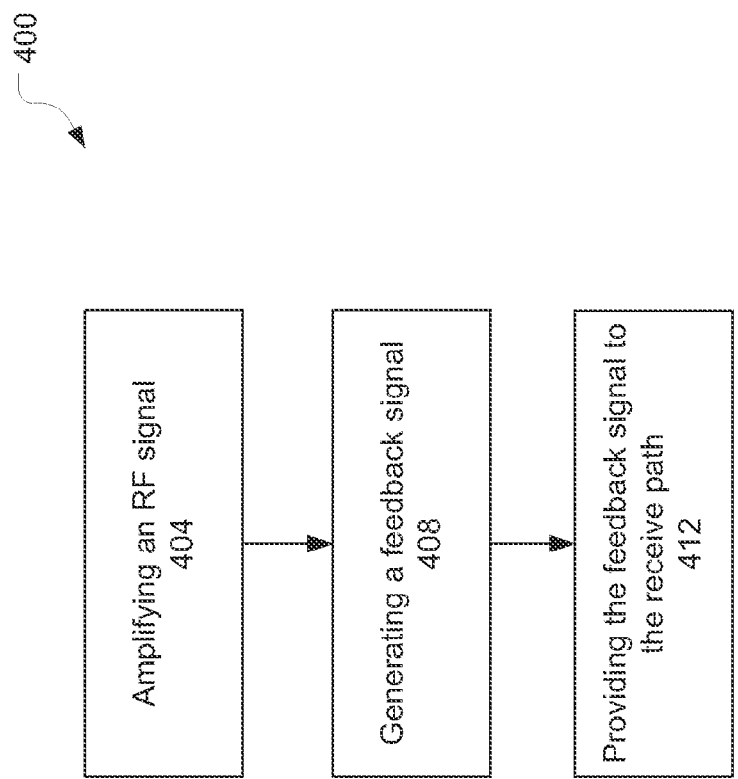
FIG. 4 is a flowchart illustrating a method of operating a wireless communication device according to various embodiments.

FIG. 4 illustrates a method 400 of operating a wireless communication device, for example, wireless communication device 300 in accordance with some embodiments.

The method 400 may include, at 404, amplifying a radio frequency signal for wireless transmission. The amplifying may be done through a transmit path such as, for example, transmit path 108 or 312.

The method 400 may further include, at 408, generating a feedback signal based on the amplified RF signal. The feedback signal may be generated by a passive attention network such as, for example, passive attenuation network 148, and/or through a feedback path such as, for example, feedback path 324. In some embodiments, the feedback signal may be an attenuated version of the amplified RF signal on the transmit path.

The method 400 may further include, at 412, providing the feedback signal to a receive path such as, for example, receive path 120 or 320. The feedback signal may be provided to the receive path at an output of an LNA, for example, LNA 124, of the receive path.

Various non-limiting examples are described below.

Example 1 includes an apparatus comprising: a transmit path having a power amplifier to amplify a first radio-frequency (RF) signal for wireless transmission; a receive path having a low-noise amplifier (LNA) to amplify a second RF signal that is received as a wireless transmission; a switch coupled with the transmit path, the receive path, and an antenna terminal, the switch to selectively couple the transmit path or the receive path with the antenna terminal; and a passive attenuation network coupled with the transmit path and further coupled with the receive path at an output of the LNA, the passive attenuation network to provide a feedback signal based on the first RF signal.

Example 2 includes the apparatus of example 1, wherein the transmit path, the receive path, the switch and the passive attenuation network comprise an RF front end module (FEM).

Example 3 includes the apparatus of example 2, wherein the apparatus further comprises: a digital pre-distorter (DPD) to predistort a third RF signal based on the feedback signal.

Example 4 includes the apparatus of example 3, wherein the DPD comprises: a signal generator coupled with the RF FEM to receive the feedback signal and to generate a predistorter signal based on the feedback signal; and a combiner coupled with the signal generator, the combiner to combine the predistorter signal with the third RF signal to provide a predistorted signal and to provide the predistored signal to the RF FEM for wireless transmission.

Example 5 includes the apparatus of example 1, wherein the passive network includes a resistor.

Example 6 includes the apparatus of example 1, wherein the passive attenuation network is directly coupled with the antenna terminal.

Example 7 includes the apparatus of example 1, wherein the passive attenuation network is directly coupled with an output of the power amplifier.

Example 8 includes the apparatus of example 1, wherein the passive attenuation network is directly coupled with the switch.

Example 9 includes a wireless communication device comprising: a radio frequency (RF) front end module (FEM) having a transmit path including a power amplifier; a receive path including a low noise amplifier coupled with a receive (RX) output port of the RF FEM; a switch to selectively couple the transmit path or the receive path to an antenna terminal; and a feedback path including an attenuation network coupled with the receive path between an output of the LNA and the RX output port and further coupled with the transmit path, the feedback path to provide a feedback signal to the RX output port; and a transceiver including a digital predistorter (DPD) coupled with the RX output port and configured to predistort an RF signal to be amplified by the power amplifier.

Example 10 includes the wireless communication device of example 9, wherein the DPD comprises: a signal generator coupled with the RX output port to receive the feedback signal and to generate a predistorter signal based on the feedback signal; and a combiner coupled with the signal generator, the combiner to combine the predistorter signal with the RF signal to provide a predistorted signal and to provide the predistorted signal to the RF FEM for wireless transmission.

Example 11 includes the wireless communication device of example 10, wherein the attenuation network comprises a resistor.

Example 12 includes the wireless communication device of example 10, wherein the attenuation network is directly coupled with the antenna terminal.

Example 13 includes the wireless communication device of example 10, wherein the attenuation network is directly coupled with an output of the power amplifier.

Example 14 includes the wireless communication device of example 10, wherein the attenuation network is directly coupled with the switch.

Example 15 includes the wireless communication device of example 10, wherein the attenuation network is a passive attenuation network that only includes one or more passive components.

Example 16 includes a method comprising: amplifying, through a transmit path, a radio frequency (RF) signal for wireless transmission; generating, through a feedback path coupled with the transmit path, a feedback signal that is an attenuated version of the amplified RF signal; and providing, by the feedback path, the feedback signal to a receive path at an output of a low noise amplifier (LNA) of the receive path.

Example 17 includes the method of example 16, wherein said feedback path includes a passive attenuation network.

Example 18 includes the method of example 17, wherein said passive attenuation network is coupled with the transmit path at an antenna switch module.

Example 19 includes the method of example 17, wherein said passive attenuation network is coupled with the transmit path at an output of a power amplifier of the transmit path.

Example 20 includes the method of example 16, wherein said providing the feedback signal includes: providing the feedback signal directly to an output port of a front-end module.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a switch having an antenna port, a receive port, and a transmit port, wherein the switch is configured to selectively couple the transmit port with the antenna port when the switch is in a transmit state and couple the receive port with the antenna port when the switch is in a receive state;
   a transmit path including a power amplifier, which receives a first radio-frequency (RF) signal from a first node and provides a first amplified RF signal to the antenna port;
   a receive path including a low noise amplifier (LNA), which receives a second RF signal from the antenna port and provides a second amplified RF signal to a second node;
   a signal generator coupled to the second node;
   a combiner coupled with the signal generator; and
   a passive attenuation network directly coupled between the antenna port and the second node, wherein:
      when the switch couples the transmit port with the antenna port, the passive attenuation network attenuates the first RF signal to generate a first attenuated RF signal and provides the first attenuated RF signal to the second node, the signal generator receives the first attenuated RF signal from the second node and generates a predistorter signal, and the combiner receives the predistorter signal from the signal generator and combines the predistorter signal with a third RF signal to provide a predistorted signal to the first node; and
      when the switch couples the receive port with the antenna port, the passive attenuation network attenuates the second RF signal from the antenna port to generate a second attenuated RF signal and provides the second attenuated RF signal to the second node.

2. The apparatus of claim 1, wherein the transmit path, the receive path, the switch and the passive attenuation network are comprised in an RF front end module (FEM).

3. The apparatus of claim 2, wherein the signal generator and the combiner are comprised in a digital pre-distorter (DPD), wherein the DPD is coupled with the RF FEM at the first node and the second node.

4. The apparatus of claim 1, wherein the passive attenuation network includes at least one of a resistor and a varactor.

5. The apparatus of claim 1, wherein the passive attenuation network does not comprise active components.

6. The apparatus of claim 1, wherein the passive attenuation network comprises a resistor.

7. The apparatus of claim 6, wherein the resistor included in the passive attenuation network has one value of a group consisting of 750 ohms, 1250 ohms, 1750 ohms, 2000 ohms, and 2250 ohms.

8. The apparatus of claim 1, wherein the passive attenuation network comprises a varactor.

9. The apparatus of claim 1 further comprising an antenna coupled to the antenna port.

10. The apparatus of claim 9 wherein the antenna comprises at least one of a directional antenna and an omnidirectional antenna.

11. The apparatus of claim 9 wherein the antenna comprises at least one of a group consisting of a dipole antenna, a monopole antenna, a patch antenna, a loop antenna, and a microstrip antenna.

12. A wireless communication device comprising:
   a radio frequency (RF) front end module (FEM) comprising:
      a switch with an antenna port, a receive port, and a transmit port, wherein the switch is configured to selectively couple the transmit port with the antenna port when the switch is in a transmit state and couple the receive port with the antenna port when the switch is in a receive state;
      a transmit path including a power amplifier, which receives a first radio-frequency (RF) signal from a first node and provides a first amplified RF signal to the antenna port;
      a receive path including a low noise amplifier (LNA), which receives a second RF signal from the antenna port and provides a second amplified RF signal to a second node; and
      a passive attenuation network directly coupled between the antenna port and the second node, wherein:
         when the switch couples the transmit port with the antenna port, the passive attenuation network attenuates the first RF signal to generate a first attenuated RF signal and provides the first attenuated RF signal to the second node, and
         when the switch couples the receive port with the antenna port, the passive attenuation network attenuates the second RF signal from the antenna port to generate a second attenuated RF signal and provides the second attenuated RF signal to the second node; and
   a transceiver including a digital predistorter (DPD) coupled with the first and second nodes, wherein the DPD comprises:
      a signal generator coupled to the second node to receive the first attenuated RF signal and to generate a predistorter signal; and
      a combiner coupled with the signal generator and configured to combine the predistorter signal with a third RF signal to provide a predistorted signal to the first node.

13. The wireless communication device of claim 12, wherein the passive attenuation network comprises at least one of a resistor and a varactor.

14. The apparatus of claim 1, wherein the passive attenuation network is coupled with the receive path at an output of the LNA.

15. The wireless communication device of claim 12 further comprising a main processor coupled to the transceiver and configured to control signal reception and signal transmission of the transceiver.

16. The wireless communication device of claim 15 further comprising a memory coupled to the main processor, wherein a basic operating system program executed by the main processor is stored in the memory.

* * * * *